(12) United States Patent
Miura et al.

(10) Patent No.: US 9,793,102 B2
(45) Date of Patent: Oct. 17, 2017

(54) SEMICONDUCTOR MANUFACTURING APPARATUS AND SEMICONDUCTOR MANUFACTURING METHOD

(71) Applicant: KABUSHIKI KAISHA TOSHIBA, Tokyo (JP)

(72) Inventors: Kazuyuki Miura, Mie (JP); Kensuke Takahashi, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 294 days.

(21) Appl. No.: 14/644,952

(22) Filed: Mar. 11, 2015

(65) Prior Publication Data

US 2016/0062349 A1    Mar. 3, 2016

(30) Foreign Application Priority Data

Sep. 1, 2014 (JP) .................. 2014-177458

(51) Int. Cl.
*H01L 21/00* (2006.01)
*H01L 21/67* (2006.01)
*H01L 21/677* (2006.01)

(52) U.S. Cl.
CPC ........ *H01L 21/00* (2013.01); *H01L 21/67253* (2013.01); *H01L 21/67745* (2013.01); *H01L 21/67754* (2013.01); *Y02P 90/28* (2015.11)

(58) Field of Classification Search
CPC ............... H01L 12/00; H01L 12/67253; H01L 12/67745
USPC ....................................................... 713/114
See application file for complete search history.

(56) References Cited

U.S. PATENT DOCUMENTS

| 6,251,800 | B1  |   | 6/2001  | Sun et al. |
| 6,403,969 | B1 | * | 6/2002  | Mera ................... H01J 37/3171 250/398 |
| 2003/0196754 | A1 | * | 10/2003 | Siniaguine .......... C23C 16/4584 156/345.1 |
| 2008/0124662 | A1 | * | 5/2008  | Yu ........................ G03F 7/70725 430/323 |
| 2011/0135424 | A1 | * | 6/2011  | Amoss, Jr. ........... B65G 67/603 414/137.9 |
| 2012/0017832 | A1 | * | 1/2012  | Chen ................... C23C 16/4584 118/723 MW |

FOREIGN PATENT DOCUMENTS

| JP | 2010-034592 | 2/2010 |
| JP | 2010-093182 | 4/2010 |
| JP | 2011-040601 | 2/2011 |

* cited by examiner

*Primary Examiner* — Vincent Tran
(74) *Attorney, Agent, or Firm* — Finnegan, Henderson, Farabow, Garrett & Dunner, L.L.P.

(57) ABSTRACT

In one embodiment, a semiconductor manufacturing apparatus includes a stage provided in a chamber, and a conveying module configured to convey a plurality of wafers into the chamber and to set the plurality of wafers on the stage. The apparatus further includes a controller configured to divide treatment time for simultaneously treating the plurality of wafers on the stage into first to K-th treatment periods where K is an integer of two or more, and to change positions of one or more of the plurality of wafers on the stage by the conveying module according to the treatment periods.

19 Claims, 7 Drawing Sheets

SEMICONDUCTOR MANUFACTURING APPARATUS AND SEMICONDUCTOR MANUFACTURING METHOD

CROSS REFERENCE TO RELATED APPLICATION

This application is based upon and claims the benefit of priority from the prior Japanese Patent Application No. 2014-177458, filed on Sep. 1, 2014, the entire contents of which are incorporated herein by reference.

FIELD

Embodiments described herein relate to a semiconductor manufacturing apparatus and a semiconductor manufacturing method.

BACKGROUND

Semiconductor manufacturing apparatuses are classified into a single-wafer treatment apparatus for treating a wafer individually and a batch treatment apparatus for treating plural wafers simultaneously. The batch treatment apparatus is advantageous that the plural wafers can be treated in a short time. However, since treatment speeds of the wafers differ depending on positions of the wafers in the batch treatment apparatus, characteristics of the wafers may vary among the wafers. On the other hand, the single-wafer treatment apparatus is advantageous that the variation of the characteristics can be suppressed among wafers. However, the single-wafer treatment apparatus takes a long time to treat plural wafers.

DETAILED DESCRIPTION

Embodiments will now be explained with reference to the accompanying drawings.

In one embodiment, a semiconductor manufacturing apparatus includes a stage provided in a chamber, and a conveying module configured to convey a plurality of wafers into the chamber and to set the plurality of wafers on the stage. The apparatus further includes a controller configured to divide treatment time for simultaneously treating the plurality of wafers on the stage into first to K-th treatment periods where K is an integer of two or more, and to change positions of one or more of the plurality of wafers on the stage by the conveying module according to the treatment periods.

(First Embodiment)

Figure 1A:
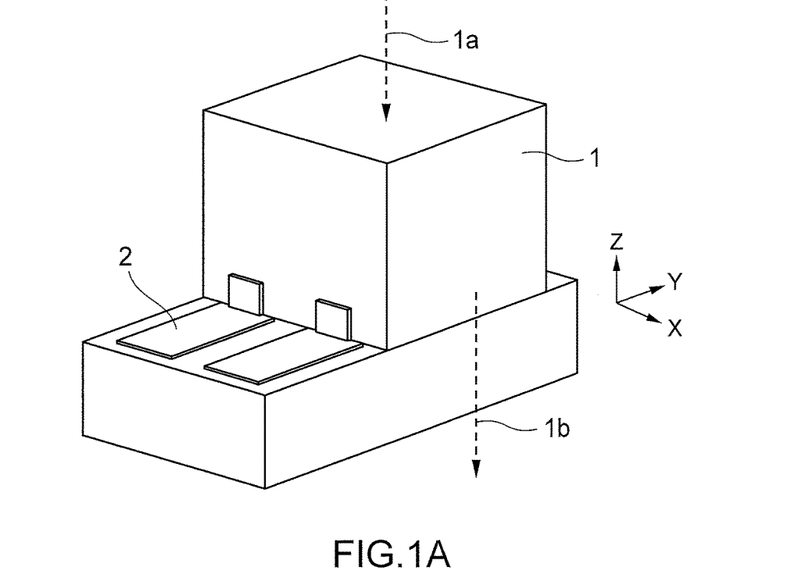
FIGS. 1A and 1B are a perspective view and a top view illustrating a structure of a semiconductor manufacturing apparatus of a first embodiment.
Figure 1B:
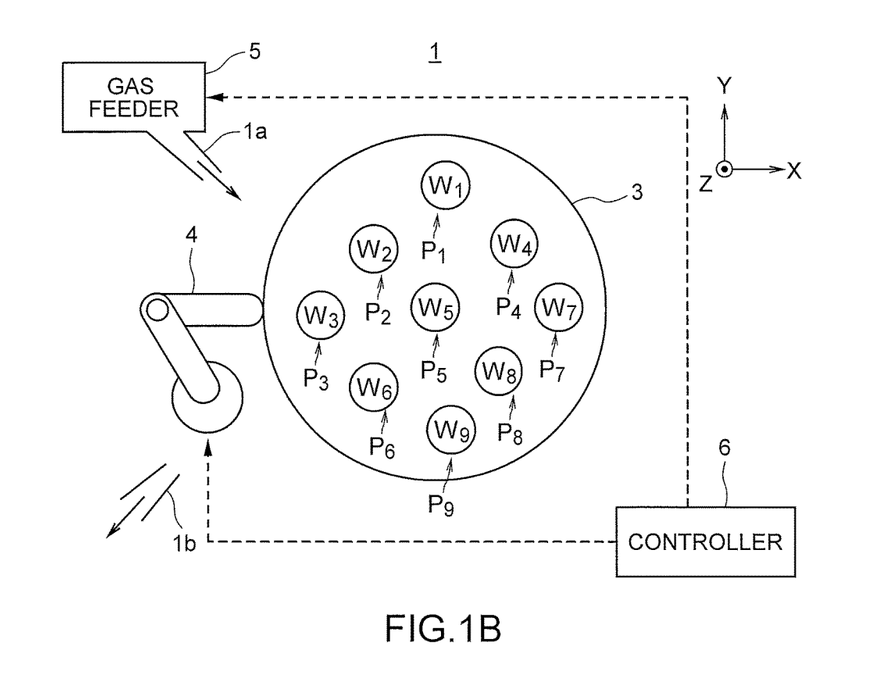

FIGS. 1A and 1B are a perspective view and a top view illustrating a structure of a semiconductor manufacturing apparatus of a first embodiment.

As shown in FIGS. 1A and 1B, the semiconductor manufacturing apparatus of the present embodiment includes a chamber 1, a cassette loading module 2, a stage 3, a conveying arm 4 as an example of a conveying module, a gas feeder 5 and a controller 6. The chamber 1 includes a gas supplying port 1a for supplying a gas into the chamber 1 and a gas discharging port 1b for discharging the gas from the chamber 1.

FIG. 1A is a perspective view illustrating an external appearance of the semiconductor manufacturing apparatus of the present embodiment. FIG. 1B is a top view illustrating the stage 3 and the like provided in the chamber 1. However, the positions of the gas feeder 5, the controller 6, the gas supplying port 1a and the gas discharging port 1b are schematically shown in FIG. 1B.

FIG. 1B illustrates plural wafers (nine wafers in this case) $W_1$ to $W_9$ disposed on the same stage 3. Reference symbols $P_1$ to $P_9$ respectively denote the positions the wafers $W_1$ to $W_9$ on the stage 3.

FIGS. 1A and 1B illustrate an X direction and a Y direction which are parallel to the top surface of the stage 3 and are perpendicular to each other, and a Z direction which is perpendicular to the top surface of the stage 3. In this specification, +Z direction is treated as an upper direction, and −Z direction is treated as a lower direction. For example, a positional relationship between the stage 3 and the wafers $W_1$ to $W_9$ is expressed such that the stage 3 is located below the wafers $W_1$ to $W_9$. In the present embodiment, −Z direction may match the gravity direction, or may not match the gravity direction.

The wafers $W_1$ to $W_9$ are set on the stage 3 according to the following procedure. First, a wafer cassette containing the wafers $W_1$ to $W_9$ is loaded to the cassette loading module 2. Next, the conveying arm 4 retrieves the wafers $W_1$ to $W_9$ from the wafer cassette, conveys the wafers $W_1$ to $W_9$ into the chamber 1, and sets the wafers $W_1$ to $W_9$ on the stage 3. The retrieval, the conveyance and the setting of the wafers $W_1$ to $W_9$ are conducted for respective wafers $W_1$ to $W_9$ in order. The wafers $W_1$ to $W_9$ are respectively set at the positions $P_1$ to $P_9$ on the stage 3.

Thereafter, the wafers $W_1$ to $W_9$ on the stage 3 are treated in the chamber 1 simultaneously. Examples of the treatment include deposition such as chemical vapor deposition (CVD) and physical vapor deposition (PVD), etching such as reactive ion etching (RIE), oxidization, nitridization, coating, epitaxial growth, impurity implantation, annealing, ashing and the like. At this time, the gas feeder 5 supplies a gas for these treatments into the chamber 1 via the gas supplying port 1a. The gas in the chamber 1 is discharged from the gas discharging port 1b.

After the treatment of the wafers $W_1$ to $W_9$ is finished, the conveying arm 4 conveys the wafers $W_1$ to $W_9$ out of the chamber 1, and storing the wafers $W_1$ to $W_9$ into the wafer cassette. The conveyance and the storing of the wafers $W_1$ to $W_9$ are conducted for respective wafers $W_1$ to $W_9$ in order.

The controller 6 controls various operations of the semiconductor manufacturing apparatus. More specifically, the controller 6 controls the conveyance of the wafer $W_1$ to $W_9$ into and out of the chamber 1 with the conveying arm 4 and the supply of the gas with the gas feeder 5. When there are devices such as a cooling device, a heating device, and an electrode for the wafers $W_1$ to $W_9$ in the semiconductor manufacturing apparatus, the controller 6 also controls the operations of these devices. The details of the operation of the controller 6 will be explained later.

An example of the stage 3 of the present embodiment is a large stage on which large wafers are set. An example of the wafers $W_1$ to $W_9$ of the present embodiment is small wafers. Therefore, according to the present embodiment, plural wafers $W_1$ to $W_9$ can be set on the same stage 3.

Figure 2A:
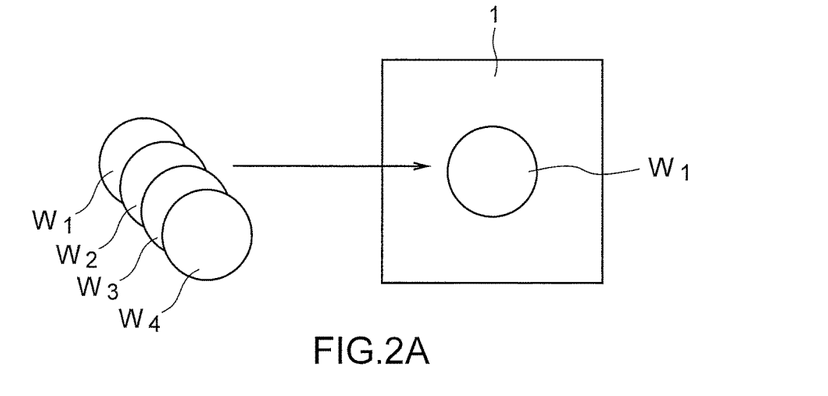
FIGS. 2A to 2C are drawings for explaining a semiconductor manufacturing method of the first embodiment.
Figure 2B:
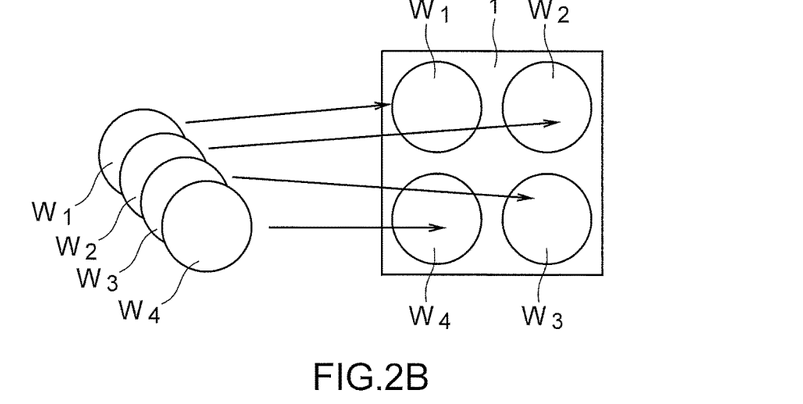
Figure 2C:
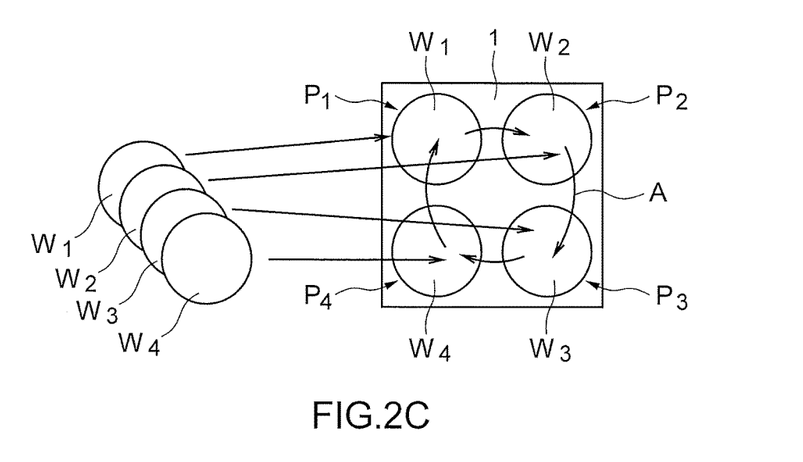

FIGS. 2A to 2C are drawings for explaining a semiconductor manufacturing method of the first embodiment.

FIG. 2A illustrates a semiconductor manufacturing method of a first comparative example of the first embodiment. The semiconductor manufacturing method of FIG. 2A is executed by a single-wafer treatment apparatus. In FIG. 2A, the wafers $W_1$ to $W_4$ are individually treated for each wafer. Therefore, total treatment time T of the wafers $W_1$ to $W_4$ of the first comparative example is given by the following expression (1).

$$T = (T_1 + T_2 + T_3)N \quad (1)$$

Reference symbol $T_1$ indicates conveyance time required to convey each wafer into and out of the chamber 1. The reference symbol $T_2$ indicates treatment preparation time required for treatment preparation of each wafer. An example of the treatment preparation includes vacuum evacuation in the chamber 1. Reference symbol $T_3$ indicates treatment time required to actually treat each wafer. Reference symbol N indicates the number of wafers $W_1$ to $W_4$ (N=4 in this case).

FIG. 2B is a semiconductor manufacturing method of a second comparative example of the first embodiment. The semiconductor manufacturing method of FIG. 2B is executed by a batch treatment apparatus. In FIG. 2B, the wafers $W_1$ to $W_4$ are treated simultaneously. Therefore, the total treatment time T of the wafers $W_1$ to $W_4$ of the second comparative example is given by the following expression (2).

$$T = T_1 N + T_2 + T_3 \quad (2)$$

In the first comparative example, the conveyance, the treatment preparation and the treatment of the wafers $W_1$ to $W_4$ are executed repeatedly N times. On the other hand, according to the second comparative example, the conveyance of the wafers $W_1$ to $W_4$ are executed repeatedly N times while the treatment preparation and the treatment of the wafers $W_1$ to $W_4$ are executed collectively and simultaneously. Therefore, according to the second comparative example, the total treatment time T of the wafers $W_1$ to $W_4$ can be reduced. However, the treatment speeds of the wafers $W_1$ to $W_4$ differ according to the positions of the wafers $W_1$ to $W_4$ in the batch treatment apparatus, and therefore the characteristics of the wafers $W_1$ to $W_4$ may vary in the second comparative example.

FIG. 2C illustrates the semiconductor manufacturing method of the first embodiment. The semiconductor manufacturing method of FIG. 2C is executed by the semiconductor manufacturing apparatus of FIGS. 1A and 1B.

In the present embodiment, the wafers $W_1$ to $W_4$ are set on the same stage 3 and are treated simultaneously. However, the controller 6 of the present embodiment divides the treatment time $T_3$ of this treatment into the first to N-th treatment periods, and the positions of the wafers $W_1$ to $W_4$ on the stage 3 are changed by the conveying arm 4 according to the treatment periods. Each treatment period of the present embodiment is $T_3/N$. An arrow A indicates how the positions of the wafers $W_1$ to $W_4$ are changed. The total treatment time T of the wafers $W_1$ to $W_4$ of the present embodiment is given by the following expression (3).

$$T = (T_1 N + T_2 + T_3/N)N \quad (3)$$
$$= T_1 N^2 + T_2 N + T_3$$

In the present embodiment, the positions of the wafers $W_1$ to $W_4$ are changed for each treatment period, and therefore the conveyance time of the wafers $W_1$ to $W_4$ before each treatment period is $T_1 N$. In the present embodiment, the treatment preparation of the wafers $W_1$ to $W_4$ for each treatment period is performed once, and therefore the treatment preparation time of the wafers $W_1$ to $W_4$ before each treatment period is $T_2$. The treatment time of the wafers $W_1$ to $W_4$ of each treatment period is $T_3/N$ as described above. Therefore, the total treatment time T of the wafers $W_1$ to $W_4$ of the present embodiment is obtained by multiplying the summation of the conveyance time, the treatment preparation time and the treatment time by N, and is given as shown in the above expression (3).

As can be understood from the expression (2) and the expression (3), the total treatment time T of the present embodiment is longer than the total treatment time T of the second comparative example (batch treatment). However, as can be understood from the expression (1) and the expression (3), the total treatment time T of the present embodiment may become shorter than the total treatment time T of the first comparative example (single-wafer treatment) depending on the values of the conveyance time $T_1$ of each wafer, treatment time $T_3$ of each wafer, and the wafer number N. In the present embodiment, variation in the characteristics of the wafers $W_1$ to $W_4$ can be suppressed by changing the positions of the wafers $W_1$ to $W_4$ during the treatment of the wafers $W_1$ to $W_4$. Therefore, according to the present embodiment, the plural wafers $W_1$ to $W_4$ can be treated in a short time while the variation in the characteristics of the wafers $W_1$ to $W_4$ can be suppressed.

The arrow A of FIG. 2C indicates how the positions of the wafers $W_1$ to $W_4$ are changed. In the present embodiment, the positions of the wafers $W_1$ to $W_4$ are changed so that the positions of the wafers $W_1$ to $W_4$ are switched with one another.

For example, in the first treatment period, the wafers $W_1$, $W_2$, $W_3$ and $W_4$ are set at positions $P_1$, $P_2$, $P_3$ and $P_4$, respectively. In the second treatment period, the positions of the wafer $W_1$, $W_2$, $W_3$ and $W_4$ are changed to positions $P_2$, $P_3$, $P_4$ and $P_1$, respectively. In the third treatment period, the positions of the wafers $W_1$, $W_2$, $W_3$ and $W_4$ are changed to positions $P_3$, $P_4$, $P_1$ and $P_2$, respectively. In the fourth treatment period, the positions of the wafers $W_1$, $W_2$, $W_3$ and $W_4$ are changed to positions $P_4$, $P_1$, $P_2$ and $P_3$, respectively. Therefore, according to the present embodiment, the variation in the characteristics of the wafers $W_1$ to $W_4$ can be suppressed.

However, when the positions of the wafers $W_1$ to $W_4$ are switched with one another, some of the wafers $W_1$ to $W_4$ may be set at the same positions again. For example, the positions of the wafers $W_1$, $W_2$, $W_3$ and $W_4$ may be changed from the positions $P_1$, $P_2$, $P_3$ and $P_4$ to the positions $P_2$, $P_3$, $P_1$ and $P_4$, respectively. For example, when the wafer at the position $P_4$ is treated so as to obtain average characteristics, the position of the wafer at the position $P_4$ may not be changed. Therefore, when changing the positions of the wafers $W_1$ to $W_4$, the positions of all the wafers $W_1$ to $W_4$ may be changed, or only the position(s) of a part of the wafers $W_1$ to $W_4$ may be changed.

The controller 6 of the present embodiment may divide the treatment time $T_3$ into the first to K-th treatment periods which are less than the wafer number N (K<N). In this case, each treatment period is $T_3/K$, and the change of the positions of the wafers $W_1$ to $W_4$ is executed K times. For example, when the wafer at the position $P_4$ is treated so as to obtain average characteristics, the change of the positions of the wafers at the positions $P_1$ to $P_3$ may be executed only three times.

The division performed K times which are less than the wafer number N as described above may also be applied to a case where it is not necessary to completely eliminate the variation in the characteristics of the wafers $W_1$ to $W_4$ and it is sufficient to somewhat reduce the variation in the characteristics of the wafers $W_1$ to $W_4$.

The treatment time $T_3$ of the present embodiment may be divided equally into the first to K-th treatment periods or may be divided unequally into the first to K-th treatment periods. For example, when the treatment time $T_3$ is divided into the first to third treatment periods, the first, second and third treatment periods may be set to $T_3/4$, $T_3/2$ and $T_3/4$, respectively.

In the present embodiment, the positions of the wafers $W_1$ to $W_4$ may be changed using a method other than switching of the positions of the wafers $W_1$ to $W_4$. For example, the positions of the wafers $W_1$, $W_2$, $W_3$ and $W_4$ may be respectively changed from the position $P_1$, $P_2$, $P_3$ and $P_4$ to the positions $P_2$, $P_3$, $P_4$ and $P_X$. The position $P_X$ is a position different from the positions $P_1$ to $P_4$. An example of such method will be explained in a second embodiment described later.

The variation in the characteristics of the wafers $W_1$ to $W_4$ is considered to be caused due to the position of the gas supplying port 1a, the position of the gas discharging port 1b, the positions of electrodes in the chamber 1 and the like. Therefore, when designing the order of changing the positions of the wafers $W_1$ to $W_4$ or designing the division number K of the treatment period, it is desired to make a design by taking such factors into consideration.

Figure 3:
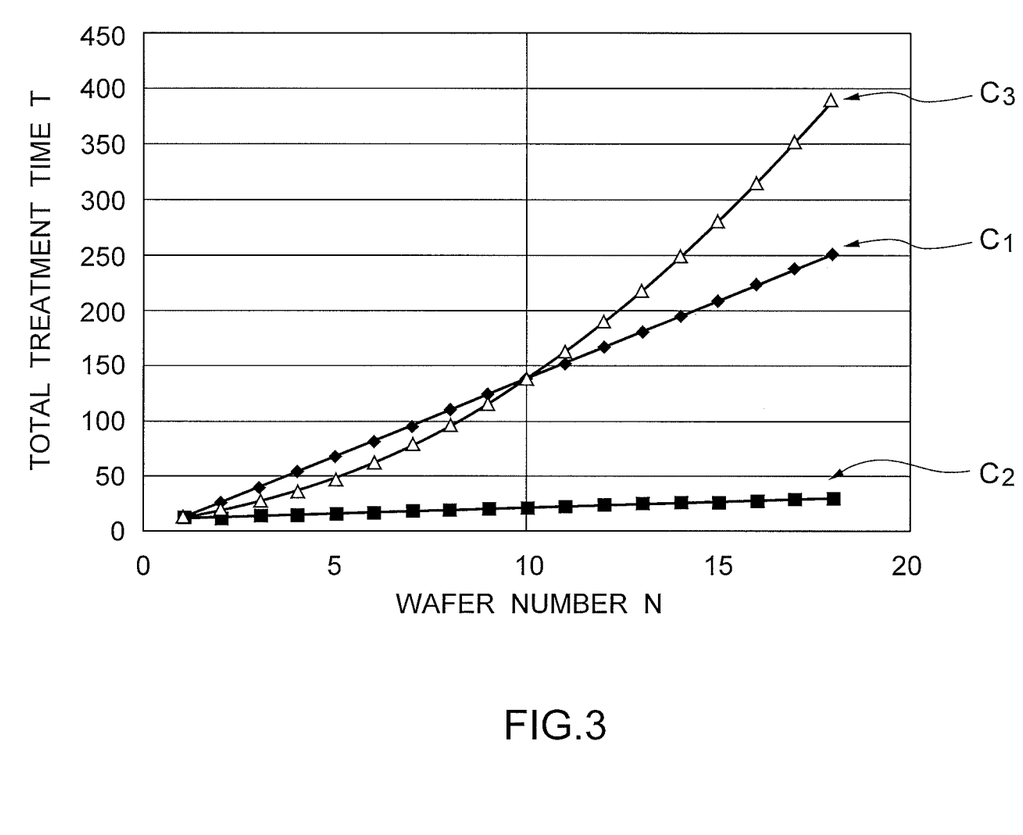
FIG. 3 is a graph for explaining advantages of the semiconductor manufacturing method of the first embodiment.

FIG. 3 is a graph for explaining advantages of the semiconductor manufacturing method of the first embodiment.

The horizontal axis of FIG. 3 indicates the wafer number N. The vertical axis of FIG. 3 indicates the total treatment time T. Reference symbols $C_1$, $C_2$ and $C_3$ indicates the total treatment time T in a case of the first comparative example of FIG. 2A, a case of the second comparative example of FIG. 2B, and a case of the present embodiment of FIG. 2C, respectively. However, the division number of the treatment period in these cases is the same as the wafer number N.

In FIG. 3, the conveyance time $T_1$ is set to 1, the treatment preparation time $T_2$ is set to 3, and the treatment time $T_3$ is set to 10. In this case, when the wafer number N is less than 10, the total treatment time T of the present embodiment is less than the total treatment time T of the first comparative example. Therefore, it is understood that the semiconductor manufacturing method of the present embodiment is suitable for cases where a small number of wafers are treated simultaneously, e.g., a case where small wafers are treated.

A condition in which the total treatment time T of the present embodiment is less than the total treatment time T of the first comparative example can be derived according to the following expression (4).

$$T_1 N^2 + T_2 N + T_3 < (T_1 + T_2 + T_3)N \quad (4)$$

If the expression (4) is solved, the condition of the wafer number N is given according to the following expression (5).

$$N < T_3/T_1 \quad (5)$$

Figure 4A:
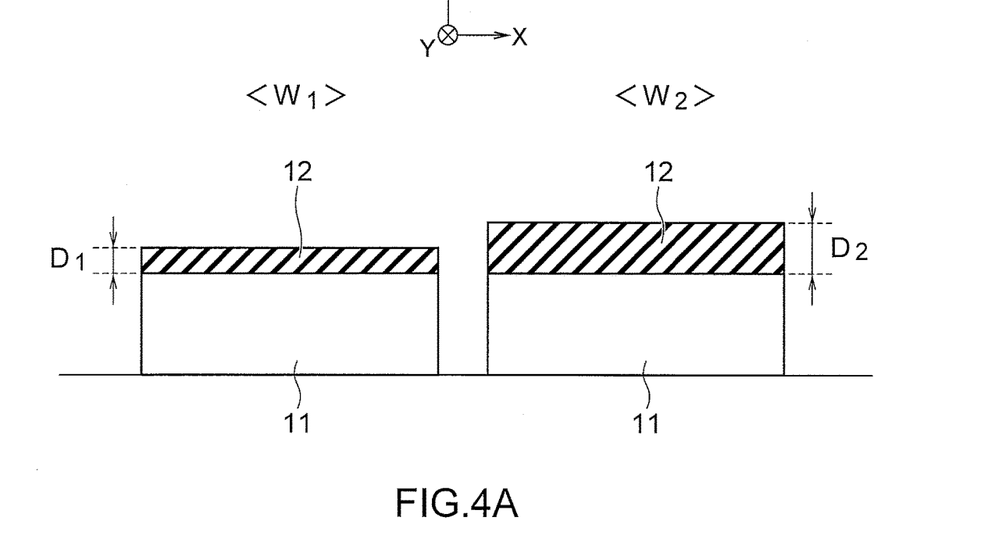
FIGS. 4A and 4B are cross sectional view for explaining advantages of the semiconductor manufacturing method of the first embodiment.
Figure 4B:
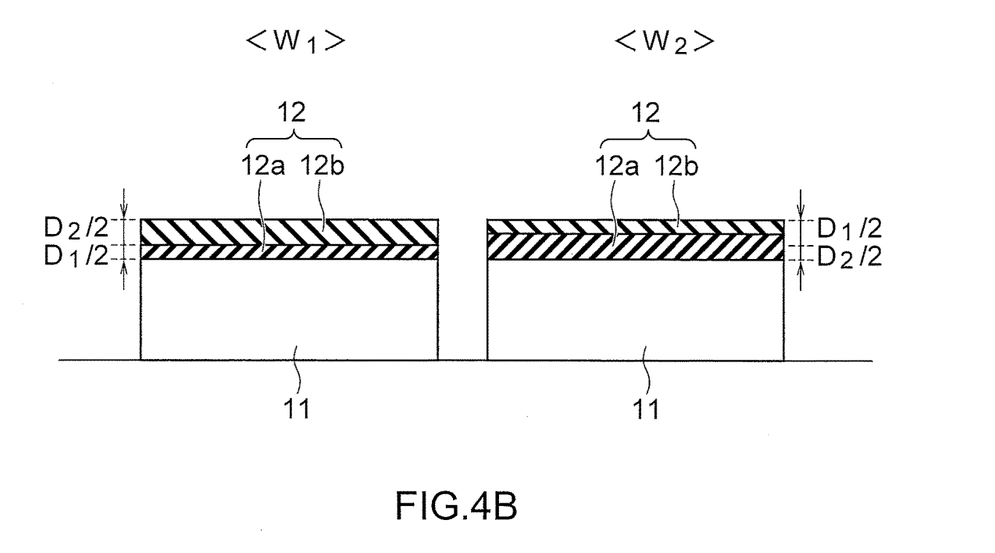

FIGS. 4A and 4B are cross sectional view for explaining advantages of the semiconductor manufacturing method of the first embodiment.

FIG. 4A illustrates wafers $W_1$ and $W_2$ treated according to the second comparative example. An example of this treatment is deposition such as CVD and PVD. Each of the wafers $W_1$ and $W_2$ includes a substrate 11 and a deposition film 12 formed on the substrate 11. However, the thicknesses of the deposition films 12 of the wafers $W_1$ and $W_2$ are $D_1$ and $D_2$ ($D_1$<$D_2$), respectively. In this manner, the thicknesses of the deposition films 12 vary between the wafers $W_1$ and $W_2$ in the second comparative example.

FIG. 4A illustrates wafers $W_1$ and $W_2$ treated according to the present embodiment. In the present embodiment, the treatment time $T_3$ of each wafer is divided into the first and second treatment periods, and the positions of the wafers $W_1$ and $W_2$ are switched between the treatment periods. Therefore, each of the wafers $W_1$ and $W_2$ includes a substrate 11, a first deposition film 12a formed in the first treatment period, and a second deposition film 12b formed in the second treatment period. Any of the thicknesses of the deposition films 12 of the wafers $W_1$ and $W_2$ is $D_1/2+D_2/2$. In this manner, the present embodiment makes it possible to suppress the variation of the thicknesses of the deposition films 12 of the wafers $W_1$ and $W_2$.

As described above, the controller 6 of the present embodiment divides the treatment time for simultaneously treating the plural wafers on the stage 4 into plural treatment periods, and changes the positions of the plural wafers on the stage 4 by the conveying arm 4 for each treatment period. Therefore, according to the present embodiment, the plural wafers can be treated in a short time while the variation of the characteristics of the wafers can be suppressed. According to the present embodiment, such treatment can be achieved without changing the usage of the semiconductor manufacturing apparatus and the contents of the treatment.

Some of the steps of the semiconductor manufacturing method of the present embodiment may be executed manually by a worker instead of being executed automatically by the semiconductor manufacturing apparatus. For example, the conveyance of the wafers into and out of the chamber 1 and the change of the positions of the wafers may be executed by a worker instead of the conveying arm 4.

(Second Embodiment)

Figure 5:
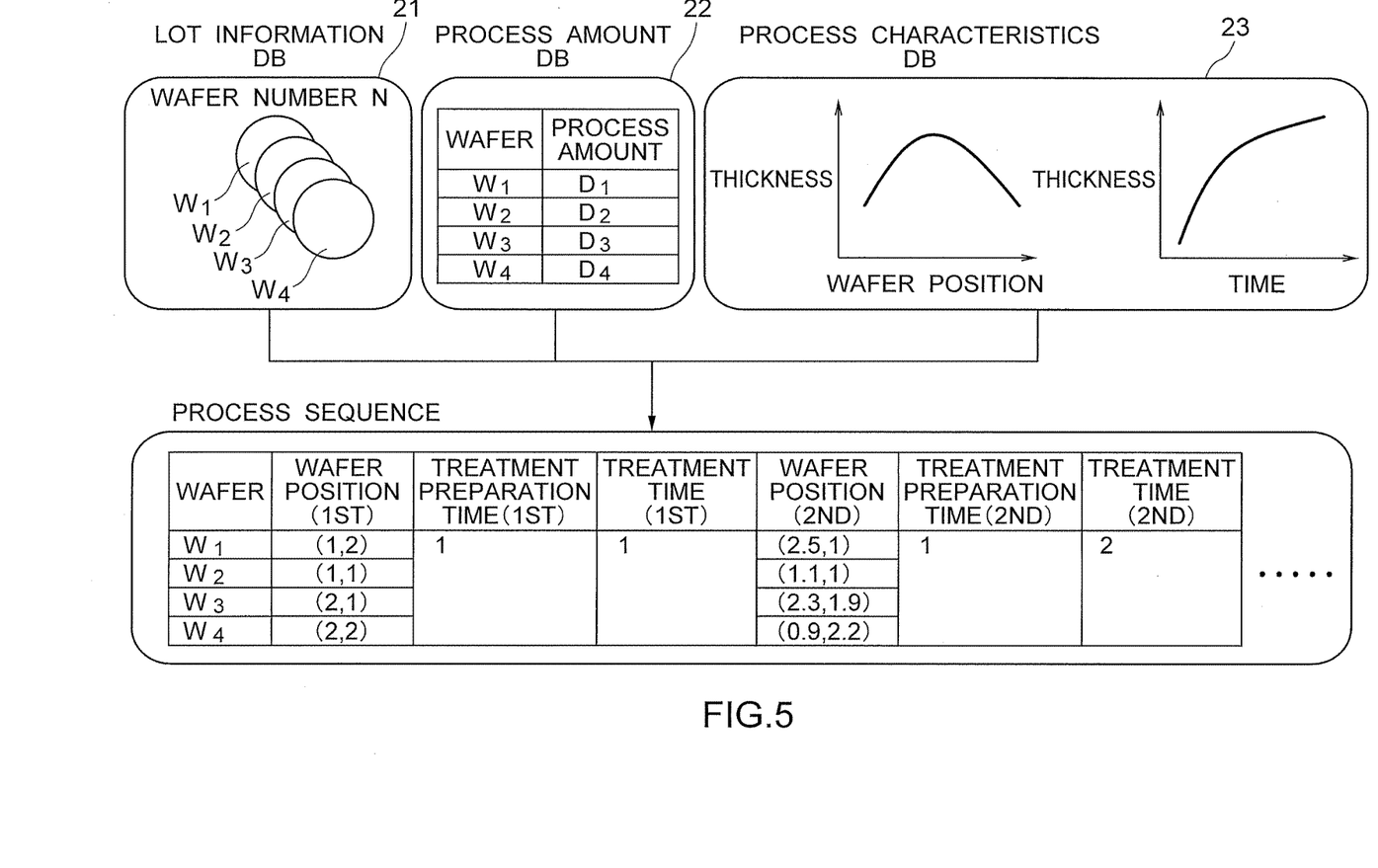
FIG. 5 is a drawing for explaining a semiconductor manufacturing method of a second embodiment.

FIG. 5 is a drawing for explaining a semiconductor manufacturing method of a second embodiment. The semiconductor manufacturing method of the present embodiment is executed by the semiconductor manufacturing apparatus of FIGS. 1A and 1B.

In the first embodiment, the treatment time of the wafers is divided into plural treatment periods in order to suppress the variation in the characteristics of the wafers. On the other hand, in the present embodiment, the treatment time of the wafers is divided into plural treatment periods in order to give desired characteristics to each wafer. In other words, in the present embodiment, the variation of the characteristics of the wafers is not suppressed, but the variation of the characteristics of the wafers is utilized.

The controller 6 of the present embodiment can access to a lot information database (DB) 21, a process amount DB 22 as an example of a process amount storage module, and a process characteristics DB 23. For example, the lot information DB 21, the process amount DB 22 and the process characteristics DB 23 are stored in a server which is connected with the semiconductor manufacturing apparatus via a network.

The lot information DB 21 stores, for example, the number N of the wafers $W_1$ to $W_4$ simultaneously treated by the semiconductor manufacturing apparatus. The process amount DB 22 stores process amount $D_1$ to $D_4$ of the wafers $W_1$ to $W_4$ in this treatment. Examples of the process amounts include a thickness of a deposition film in a deposition, an etching amount of a process target film in an etching, and a dose amount of impurity in an impurity implantation.

The process characteristics DB 23 stores process characteristics of the semiconductor manufacturing apparatus when the semiconductor manufacturing apparatus treats the wafers $W_1$ to $W_4$. FIG. 5 illustrates, as an example of such process characteristics, relationship between a position of a wafer and a thickness of a deposition film. FIG. 5 indicates that when the wafer is set in a central position of the stage 3, the thickness of the deposition film becomes thicker, and when the wafer is set in a peripheral portion of the stage 3, the thickness of the deposition film becomes thinner. FIG. 5 further illustrates, as an example of the process characteristics, relationship between the time of the deposition and the thickness of the deposition film.

When the treatment time of the wafers is divided into the first to K-th treatment periods where K is an integer of two or more, the controller 6 accesses the lot information DB 21, the process amount DB 22 and the process characteristics DB 23. The controller 6 then determines the division number K of the treatment periods, the length of each treatment period, the positions of the wafers $W_1$ to $W_4$ in each treatment period and the like, based on the information in the databases 21 to 23. The controller 6 manages the determined contents as a process sequence, and controls the treatment of the wafers $W_1$ to $W_4$ in accordance with the process sequence.

FIG. 5 shows, as the information included in the process sequence, the wafer positions, the treatment preparation time and the treatment time in the first treatment period, and the wafer positions, the treatment preparation time and the treatment time in the second treatment period. The wafer position of each wafer indicates an X coordinate and a Y coordinate on the stage 3. In FIG. 5, as it is understood by comparing the coordinates in the first treatment period and the coordinates in the second treatment period, the positions of the wafers $W_1$ to $W_4$ are changed by using a method other than switching.

The controller 6 of the present embodiment generates the process sequence so that the process amounts of the wafers $W_1$ to $W_4$ in the first to K-th treatment periods respectively become the process amounts $D_1$ to $D_4$, and controls the treatment of the wafers $W_1$ to $W_4$ in accordance with the process sequence. For example, when the process amounts $D_1$ to $D_4$ indicate the thicknesses of the deposition films, the thicknesses of the deposition films of the wafers $W_1$ to $W_4$ respectively become the thicknesses $D_1$ to $D_4$ after the treatment in the first to K-th treatment periods is finished. In this manner, according to the present embodiment, desired characteristics can be given to the wafers $W_1$ to $W_4$ by using the variation in the characteristics of the wafers $W_1$ to $W_4$.

When the controller 6 of the present embodiment generates the process sequence, the controller 6 of the present embodiment also accesses the lot information DB 21 and the process characteristics DB 23. The wafer number N in the lot information DB 21 is used to determine, for example, the division number K of the treatment periods. The information in the process characteristics DB23 is used to determine, for example, the positions of the wafers $W_1$ to $W_4$. For example, when the deposition film of any given wafer is desired to be thicker, the wafer is set in the central portion of the stage 3 for a longer period of time. Since the process characteristics of the semiconductor manufacturing apparatus also depends on the wafer number N, the wafer number N in the lot information DB 21 can also be used to determine the positions of the wafers $W_1$ to $W_4$ and the like.

Figure 6:
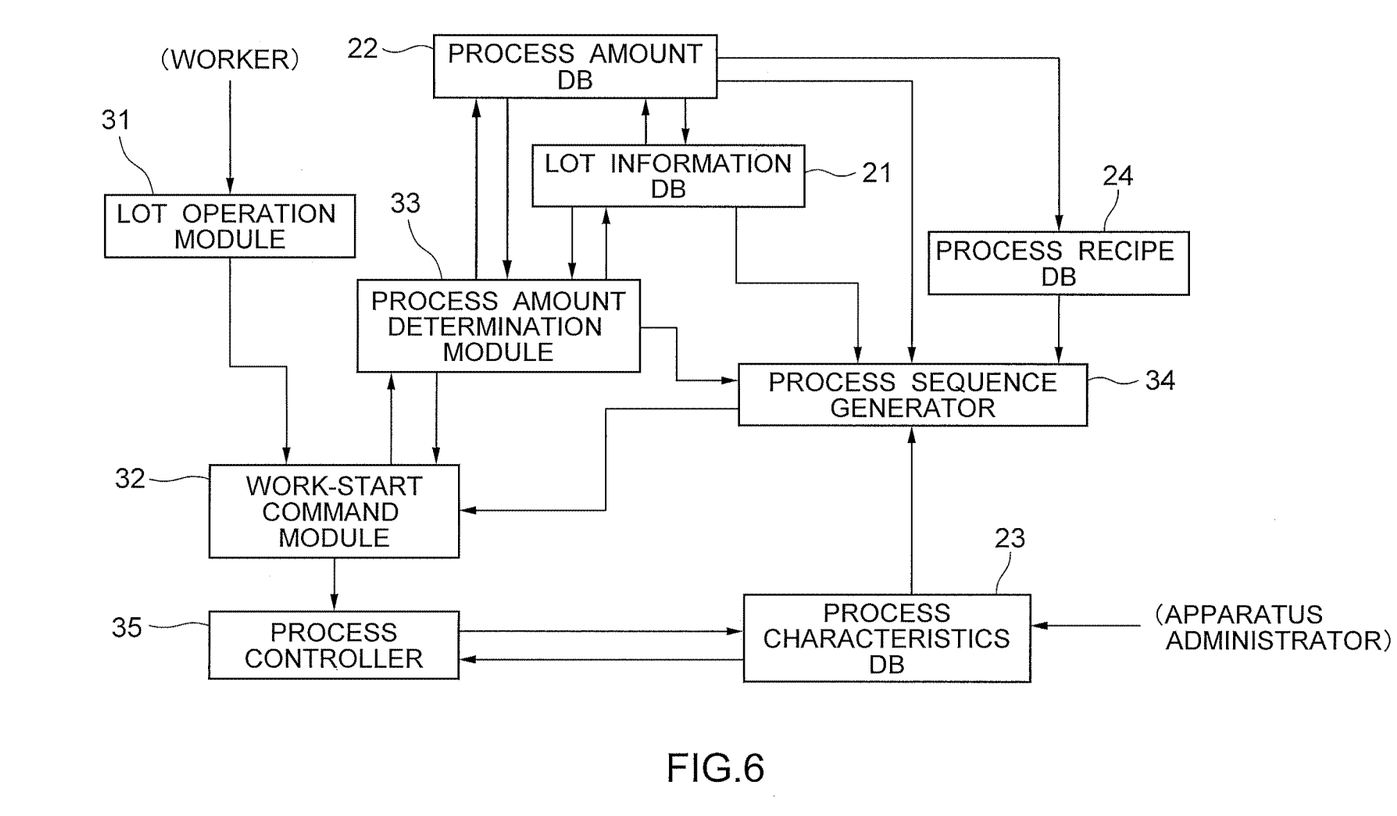
FIG. 6 is a block diagram for explaining operation of a controller of the second embodiment.

FIG. 6 is a block diagram for explaining operation of the controller 6 of the second embodiment.

The controller 6 of the present embodiment includes a lot operation module 31, a work-start command module 32, a process amount determination module 33, a process sequence generator 34 and a process controller 35.

The lot operation module 31 receives a work-start operation for starting the treatment of the wafers $W_1$ to $W_4$ from a worker who operates the semiconductor manufacturing apparatus. In this case, the work-start command module 32 determines a treatment method of the wafers $W_1$ to $W_4$, and transmits a work-start command of the determined treatment method. For example, the work-start command module 32 determines whether the dividing procedure explained above is to be applied to the treatment of the wafers $W_1$ to $W_4$.

The process amount determination module 33 accesses the lot information DB 21 to determine whether the number N of the wafers $W_1$ to $W_4$ is two or more. The process amount determination module 33 further accesses the process amount DB 22 to determine whether the process amount $D_1$ to $D_4$ of the wafers $W_1$ to $W_4$ are the same or not. The determination results of the process amount determination module 33 are sent to the work-start command module 32 and the process sequence generator 34.

The process sequence generator 34 accesses the lot information DB 21, the process amount DB 22, the process characteristics DB 23 and a process recipe DB 24 to generate the process sequence for achieving the process amount $D_1$ to $D_4$ of the wafers $W_1$ to $W_4$. The information in the process characteristics DB 23 is preliminarily set by an apparatus administrator of the semiconductor manufacturing apparatus.

The process recipe DB 24 is, for example, stored in the server connected to the semiconductor manufacturing apparatus via the network. The process recipe DB 24 stores process recipes for treating the wafers $W_1$ to $W_4$. Examples of the process recipes include a type of a gas, a flow rate of a gas, and a heating temperature of the wafers $W_1$ to $W_4$.

The process controller 35 controls the treatment of the wafers $W_1$ to $W_4$. For example, when the process amounts $D_1$ to $D_4$ of the wafers $W_1$ to $W_4$ are the same, the treatment of the wafers $W_1$ to $W_4$ is controlled as explained in the first embodiment. When the process amounts $D_1$ to $D_4$ of the wafers $W_1$ to $W_4$ are different, the treatment of the wafers $W_1$ to $W_4$ is controlled in accordance with the process sequence as explained in the second embodiment.

Figure 7:
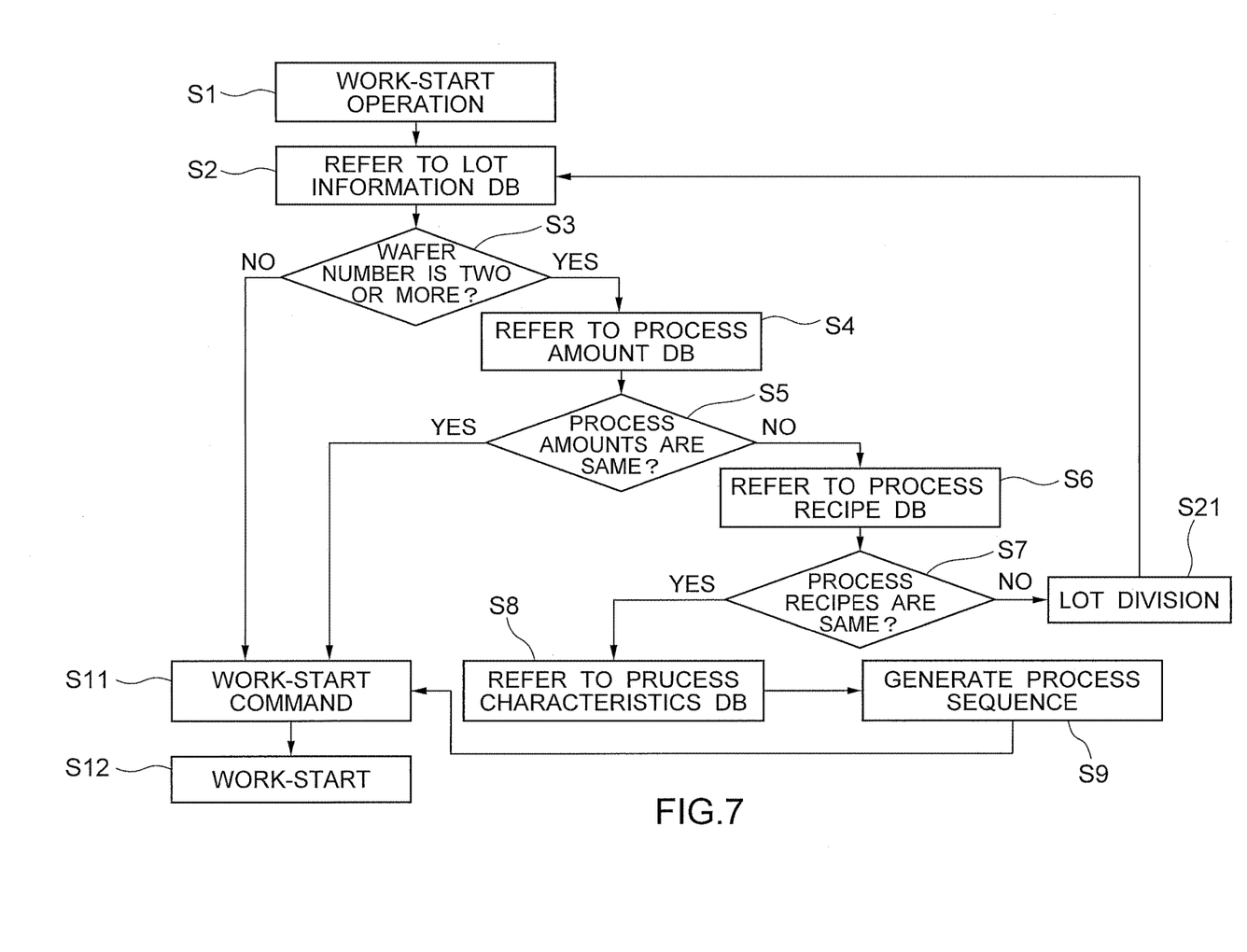
FIG. 7 is a flowchart for explaining the semiconductor manufacturing method of the second embodiment.

FIG. 7 is a flowchart for explaining the semiconductor manufacturing method of the second embodiment.

When the lot operation module 31 receives the work-start operation (step S1), the process amount determination module 33 refers to the lot information DB 21 (step S2), and determines whether the number N of wafers $W_1$ to $W_4$ is two or more (step S3).

When the wafer number N is determined to be one, the work-start command module 32 transmits the work-start command for treating the wafer with non-dividing procedure (step S11), and the process controller 35 treats the wafer in accordance with the work-start command (step S12).

When the number N of wafers $W_1$ to $W_4$ is determined to be two or more, the process amount determination module 33 refers to the process amount DB 22 (step S4), and determines whether the process amounts $D_1$ to $D_4$ of the wafers $W_1$ to $W_4$ are the same or not (step S5).

When the process amounts $D_1$ to $D_4$ of the wafers $W_1$ to $W_4$ are determined to be the same, the work-start command module 32 transmits the work-start command for processing the wafers $W_1$ to $W_4$ with the dividing procedure of the first embodiment (step S11), and the process controller 35 treats the wafers $W_1$ to $W_4$ in accordance with the work-start command (step S12).

When the process amounts $D_1$ to $D_4$ of the wafers $W_1$ to $W_4$ are different, the process sequence generator 34 refers to the process recipe DB 24 (step S6), and determines whether the process recipes of the wafers $W_1$ to $W_4$ are the same or not (step S7).

When the process recipes of the wafers $W_1$ to $W_4$ are determined to be different, the wafers $W_1$ to $W_4$ cannot be treated simultaneously, and therefore the process sequence generator 34 divides the wafers $W_1$ to $W_4$ into groups of wafers processed by the same recipes (step S21). Then, the procedure in step S2 and subsequent steps is executed again on the divided groups of wafers.

When the process recipes of the wafers $W_1$ to $W_4$ are determined to be the same, the process sequence generator 34 refers to the process characteristics DB 23 and the like (step S8), and generates the process sequence for achieving the process amounts $D_1$ to $D_4$ of the wafers $W_1$ to $W_4$ (step S9). Subsequently, the work-start command module 32 transmits the work-start command for treating the wafers $W_1$ to $W_4$ with the dividing procedure of the second embodiment (step S11), and the process controller 35 treats the wafers $W_1$ to $W_4$ in accordance with the process sequence (step S12).

As described above, the controller 6 of the present embodiment changes the positions of the wafers $W_1$ to $W_4$ in each treatment period so that the process amounts of the wafers $W_1$ to $W_4$ by the treatment in the first to K-th treatment periods respectively become the process amounts $D_1$ to $D_4$. Therefore, according to the present embodiment, the wafers $W_1$ to $W_4$ can be treated in a short time while desired characteristics can be given to the wafers $W_1$ to $W_4$.

In the second embodiment, the division number K of the treatment periods may be more than the wafer number N (K>N). This makes it possible, for example, to give desired characteristics to the wafers $W_1$ to $W_4$ with a higher degree of precision. This is also applicable to the first embodiment.

As described above, according to the first and second embodiments, plural wafers can be appropriately treated in a short time.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:
1. A semiconductor manufacturing apparatus comprising:
a stage provided in a chamber;
a conveying module configured to convey a plurality of wafers into the chamber and to set the plurality of wafers on the stage;
a controller configured to divide treatment time for simultaneously treating the plurality of wafers on the stage into first to K-th treatment periods where K is an integer of two or more, and to change positions of one or more of the plurality of wafers on the stage by the conveying module according to the treatment periods.

2. The apparatus of claim 1, wherein the division number K of the first to K-th treatment periods is equal to a number of the plurality of wafers.

3. The apparatus of claim 1, wherein the division number K of the first to K-th treatment periods is less than a number of the plurality of wafers.

4. The apparatus of claim 1, wherein the controller changes the positions of the wafers so that the positions of the wafers are switched with each other.

5. The apparatus of claim 1, wherein
the plurality of wafers include first to N-th wafers where N is an integer of two or more, and
the controller accesses a process amount storage module configured to store first to N-th process amounts for the first to N-th wafers, and changes the positions of one or more of the first to N-th wafers so that process amounts of the first to N-th wafers in the first to K-th treatment periods respectively become the first to N-th process amounts.

6. The apparatus of claim 5, wherein the controller accesses a wafer information storage module configured to store a number of the plurality of wafers, and determines the division number K of the first to K-th treatment periods based on the number of the plurality of wafers.

7. The apparatus of claim 5, wherein the controller accesses a process characteristics storage module configured to store a process characteristic of the semiconductor manufacturing apparatus for processing the wafers, and determines the positions of the wafers based on the process characteristic.

8. The apparatus of claim 5, wherein the process amounts are amounts related to formation of a film onto the wafers, removal of a film on the wafers, or impurity implantation to the wafers.

9. The apparatus of claim 1, wherein the controller equally divides the treatment time into the first to K-th treatment periods.

10. The apparatus of claim 1, wherein the controller unequally divides the treatment time into the first to K-th treatment periods.

11. A semiconductor manufacturing method comprising:
conveying a plurality of wafers into a chamber;
setting the plurality of wafers on a stage in the chamber; and
dividing treatment time for simultaneously treating the plurality of wafers on the stage into first to K-th treatment periods where K is an integer of two or more, and changing positions of one or more of the plurality of wafers on the stage according to the treatment periods,
wherein the division number K of the first to K-th treatment periods is equal to a number of the plurality of wafers.

12. The method of claim 11, wherein the positions of the wafers are changed so that the positions of the wafers are switched with each other.

13. The method of claim 11, wherein the treatment time is equally divided into the first to K-th treatment periods.

14. A semiconductor manufacturing method comprising:
conveying a plurality of wafers into a chamber;
setting the plurality of wafers on a stage in the chamber; and
dividing treatment time for simultaneously treating the plurality of wafers on the stage into first to K-th treatment periods where K is an integer of two or more, and changing positions of one or more of the plurality of wafers on the stage according to the treatment periods,
wherein the division number K of the first to K-th treatment periods is less than a number of the plurality of wafers.

15. A semiconductor manufacturing method comprising:
conveying a plurality of wafers into a chamber;
setting the plurality of wafers on a stage in the chamber; and
dividing treatment time for simultaneously treating the plurality of wafers on the stage into first to K-th treatment periods where K is an integer of two or more, and changing positions of one or more of the plurality of wafers on the stage according to the treatment periods,
wherein:
the plurality of wafers include first to N-th wafers where N is an integer of two or more, and
the method further comprises accessing a process amount storage module configured to store first to N-th process amounts for the first to N-th wafers, and changing the positions of one or more of the first to N-th wafers so that process amounts of the first to N-th wafers in the first to K-th treatment periods respectively become the first to N-th process amounts.

16. The method of claim 15, further comprising accessing a wafer information storage module configured to store a number of the plurality of wafers, and determining the division number K of the first to K-th treatment periods based on the number of the plurality of wafers.

17. The method of claim 15, further accessing a process characteristics storage module configured to store a process characteristic of a semiconductor manufacturing apparatus for processing the wafers, and determining the positions of the wafers based on the process characteristic.

18. The method of claim 15, wherein the process amounts are amounts related to formation of a film onto the wafers, removal of a film on the wafers, or impurity implantation to the wafers.

19. A semiconductor manufacturing method comprising:
conveying a plurality of wafers into a chamber;
setting the plurality of wafers on a stage in the chamber; and
dividing treatment time for simultaneously treating the plurality of wafers on the stage into first to K-th treatment periods where K is an integer of two or more, and changing positions of one or more of the plurality of wafers on the stage according to the treatment periods,
wherein the treatment time is unequally divided into the first to K-th treatment periods.

* * * * *